United States Patent
Mizuno

(10) Patent No.: US 9,117,755 B2
(45) Date of Patent: Aug. 25, 2015

(54) METHOD FOR FABRICATING SEMICONDUCTOR DEVICE

(71) Applicant: SUMITOMO ELECTRIC INDUSTRIES, LTD., Osaka (JP)

(72) Inventor: Shinya Mizuno, Kanagawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/265,510

(22) Filed: Apr. 30, 2014

(65) Prior Publication Data

US 2014/0235048 A1 Aug. 21, 2014

Related U.S. Application Data

(62) Division of application No. 13/186,894, filed on Jul. 20, 2011, now Pat. No. 8,748,303.

(30) Foreign Application Priority Data

Jul. 26, 2010 (JP) ................... 2010-167367

(51) Int. Cl.
*H01L 21/285* (2006.01)
*H01L 29/45* (2006.01)
(Continued)

(52) U.S. Cl.
CPC ........ *H01L 21/28575* (2013.01); *H01L 29/452* (2013.01); *H01L 29/66462* (2013.01); *H01L 29/7787* (2013.01); *H01L 29/2003* (2013.01)

(58) Field of Classification Search
CPC ................... H01L 29/66431; H01L 29/66462; H01L 29/778; H01L 29/7835; H01L 29/78624
USPC .......... 257/E29.279; 438/286, 142, 161, 167, 438/179
See application file for complete search history.

(56) References Cited

U.S. PATENT DOCUMENTS

| | | | |
|---|---|---|---|
| 7,488,634 B2 | 2/2009 | Shin | |
| 2004/0201038 A1* | 10/2004 | Kimura et al. | ............... 257/192 |

(Continued)

FOREIGN PATENT DOCUMENTS

| | | |
|---|---|---|
| JP | 10-303407 A | 11/1998 |
| JP | 2007-059508 A | 3/2007 |

(Continued)

OTHER PUBLICATIONS

Oishi et. al., "High Performance GaN Transistors with Ion Implantation Doping", Mitsubishi Denki Giho, 2005, Feature Paper 07, p. 537.

(Continued)

*Primary Examiner* — Daniel Whalen
*Assistant Examiner* — Suberr Chi
(74) *Attorney, Agent, or Firm* — Westerman, Hattori, Daniels & Adrian, LLP

(57) ABSTRACT

A method for fabricating a semiconductor device includes forming ohmic electrodes on a source region and a drain region of a nitride semiconductor layer, forming a low-resistance layer between an uppermost surface of the nitride semiconductor layer and the ohmic electrodes by annealing the nitride semiconductor layer, removing the ohmic electrodes from at least one of the source region and the drain region after forming the low-resistance layer, and forming at least one of a source electrode and a drain electrode on the low-resistance layer, the at least one of a source electrode and a drain electrode having an edge, a distance between the edge and a gate electrode is longer than a distance between an edge of the low-resistance layer and the gate electrode.

4 Claims, 6 Drawing Sheets

(51) Int. Cl.
*H01L 29/66* (2006.01)
*H01L 29/778* (2006.01)
*H01L 29/20* (2006.01)

(56) References Cited

U.S. PATENT DOCUMENTS

2008/0237639 A1  10/2008  Nanjo et al.
2010/0327292 A1* 12/2010  Dwilinski et al. ............. 257/76
2011/0068371 A1*  3/2011  Oka ............................ 257/194
2011/0095343 A1   4/2011  Chan et al.
2011/0248283 A1* 10/2011  Cao et al. ...................... 257/76

FOREIGN PATENT DOCUMENTS

JP  2009-049358 A   3/2009
JP  2009-224643 A  10/2009

OTHER PUBLICATIONS

Moon et. al., "55% PAE and High Power Ka-Band GaN HEMTs with Linearized Transconductance via n+GaN Source Contact Ledge", IEEE Electron Device Letters, vol. 29, No. 8, 2008, pp. 834 837.
Japanese Office Action dated Sep. 24, 2014, issued in corresponding JP application No. 2010-167367 with English translation (6 pages).

* cited by examiner

METHOD FOR FABRICATING SEMICONDUCTOR DEVICE

CROSS-REFERENCE TO RELATED APPLICATION

This application is a divisional of U.S. application Ser. No. 13/186,894, filed on Jul. 20, 2011, which is based upon and claims the benefit of priority of the prior Japanese Patent Application No. 2010-167367, filed on Jul. 26, 2010, the entire contents of which are incorporated herein by reference.

BACKGROUND (i) Technical Field

A certain aspect of embodiments described herein is related to a method for fabricating a semiconductor device. Another aspect of embodiments described, herein is related to a method for fabricating a semiconductor device including a nitride semiconductor layer.

(ii) Related Art

In a semiconductor device such as an FET (Field Effect Transistor), electrodes are formed on a semiconductor layer. in order to make it easy to flow a current between electrodes, it is required to form a low-resistance layer in a nitride semiconductor layer. The following paper describes an art of forming a low-resistance layer by implanting atoms in a semiconductor layer (Toshiyuki Oishi et. al., "High Performance GaN Transistors with Ion Implantation Doping", Mitsubishi Denki Giho, August 2005, Feature Paper 07). Another paper discloses an art of etching a low-resistance layer to realize a desired interval between electrodes as well as the low-resistance layer (see J. S. Moon et. al., "55% PAE and High Power Ka-Band GaN HEMTs with Linearized Transconductance via n+GaN Source Contact Ledge", IEEE ELECTRON DEVICE LETTERS, Vol. 29, No. 8, August 2008, pp. 834-837)

In order to prevent electrodes from being short-circuited, it is required to keep the electrodes spaced apart from each other at a given interval. However, the prior art may have an increase in the production cost of the semiconductor device and a difficulty in forming the low-resistance layer reliably.

SUMMARY

The present invention was made in view of the above circumstance. According to an aspect of the present invention, there is provided a method for fabricating a semiconductor device including forming ohmic electrodes on a source region and a drain region of a nitride semiconductor layer; forming a low-resistance layer between an uppermost surface of the nitride semiconductor layer and the ohmic electrodes by annealing the nitride semiconductor layer; removing the ohmic electrodes from at least one of the source region and the drain region after forming the low-resistance layer; and forming at least one of a source electrode and a drain electrode on the low-resistance layer, the at least one of a source electrode and a drain electrode having an edge, a distance between the edge and a gate electrode is longer than a distance between an edge of the low-resistance layer and the gate electrode.

DETAILED DESCRIPTION

Figure 1A:
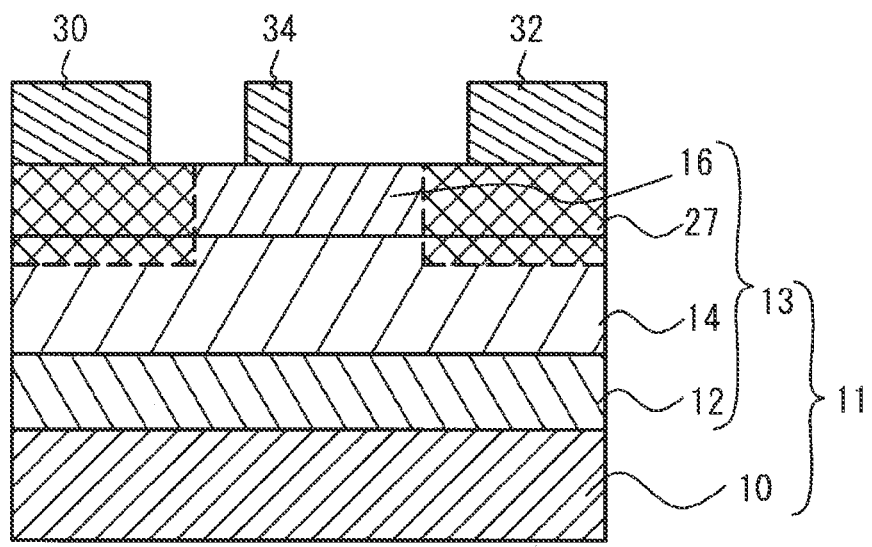
FIG. 1A is a cross-sectional view of a semiconductor device in accordance with a first comparative example.

First, a comparative example is described FIG. 1A is a cross-sectional view of a semiconductor device in accordance with a first comparative example.

As illustrated in FIG. 1, the semiconductor device of the first comparative example includes an insulation substrate 10, a buffer layer 12, a GaN layer 14, an electron supply layer 16, a source electrode 30, a drain electrode 32, and a gate electrode 34.

The source electrode 30, the drain electrode 32 and the gate electrode 34 are formed on the electron supply layer 16. The gate electrode 34 is interposed between the source electrode 30 and the drain electrode 32. The source electrode 30 and the drain electrode 32 may be formed by stacking, for example, Ta and Al (Ta/Al) on the electron supply layer 16 in this order. The gate electrode 34 may be formed by stacking, for example, Ni and Au (Ni/Au) on the electron supply layer 16 in this order. As indicated as blocks formed by broken lines having diagonal grids, ion implantation layers 27 are formed in the GaN layer 14 and the electron supply layer 16. The ion implantation layers 27 are layers by activating the GaN layer 14 and the electron supply layer 16 by implanting impurities such as Si.

In order to suppress loss of signal, it is required to reduce the electrical resistance between the electrodes. For reduction in the electrical resistance, it is preferable to reduce the distance between the gate and the drain. In contrast, it is required to have a sufficient distance between the gate and the source and that between the gate and the drain in order to suppress short-circuiting between the electrodes.

In the first comparative example, the distance between the electrodes increases to form the ion implantation layers 27. However, in order to form the ion implantation layers 27 after the ion implantation process, it is required to perform annealing at a temperature as high as at least 1000° C. for activation of the GaN layer 14 and the electron supply layer 16. The high-temperature annealing requires a heat treatment facility. A heat-resistant sheet for protecting the semiconductor substrate may be used. However, this may increase the fabrication cost of the semiconductor device. Now, a second comparative example is described.

Figure 1B:
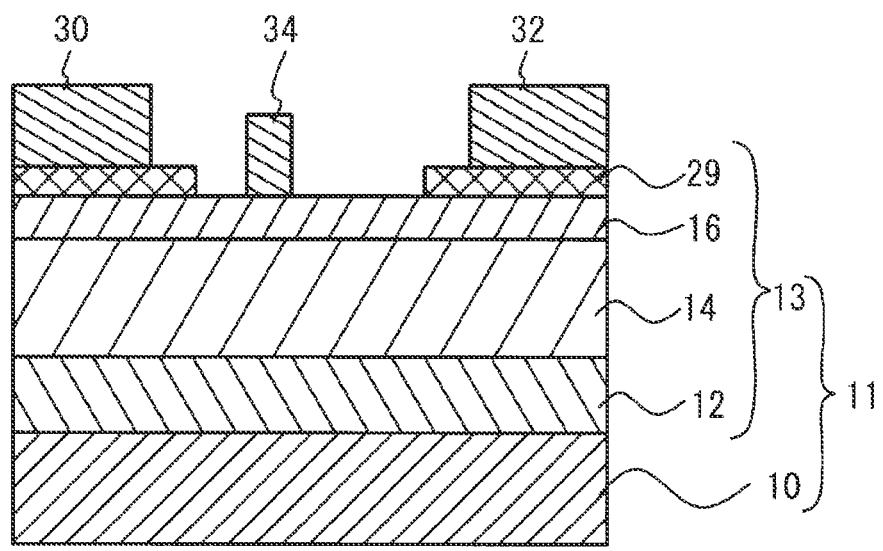
FIG. 1B is a cross-sectional view of a semiconductor device in accordance with a second comparative example.

FIG. 1B is a cross-sectional view of a semiconductor device in accordance with a second comparative example. Parts of the second comparative example that are similar to those previously described are not described here.

As illustrated in FIG. 1B, the semiconductor device of the second comparative example is configured to form a low-resistance cap layer 29 made of, for example, n-type GaN, on the electron supply layer 16. The low-resistance cap layer 29 is etched, and the gate electrode 34 is formed on an exposed upper surface of the electron supply layer 16. In the second comparative example, the size of the electrodes and the regions to be removed by etching may he varied to adjust the gate-source distance, the gate-drain distance and the size of the low-resistance cap layer 29.

However, since GaN is chemically stable, it may be difficult to remove the low-resistance cap layer 29 by etching and perform reliable etching. Instable etching may degrade the contact between the gate electrode 34 and the electron supply layer 16. This may cause leakage current between the gate and the source and may make the pinch-off current unstable. Thus, the reliability of the semiconductor device is degraded.

Embodiments of the invention are now described with reference to the drawings.

(First Embodiment)

A structure of an exemplary semiconductor device is described. FIG. 2A through FIG. 3C are cross-sectional views that describe a method for fabricating a semiconductor device in accordance with a first embodiment.

Figure 2A:
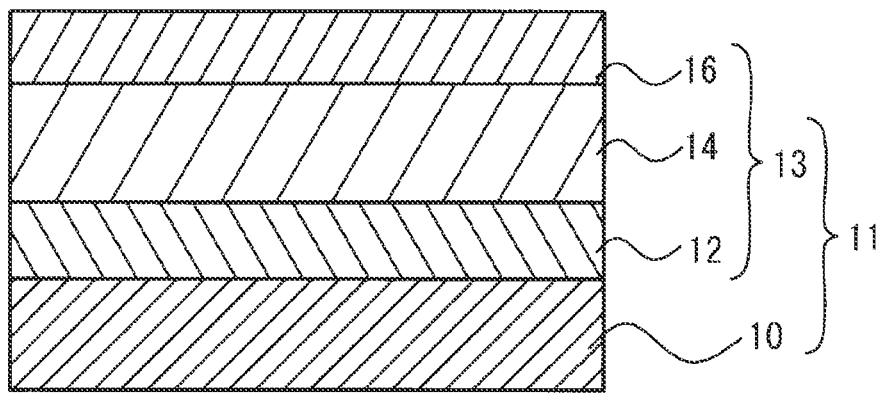
FIGS. 2A through 2C are cross-sectional views that illustrate an exemplary method for fabricating a semiconductor device in accordance with a first embodiment.

As illustrated in FIG. 2A, a semiconductor substrate 11 is prepared. The semiconductor substrate 11 includes an insulation substrate 10, a buffer layer 12, a GaN layer 14 and an electron supply layer 16. More particularly, the insulation substrate 10, the buffer layer 12, the GaN layer 14 and the electron supply layer 16 are formed in this order from the bottom side. The GaN layer 14 functions as a channel layer. The buffer layer 12, the GaN layer 14 and the electron supply layer 16 form a nitride semiconductor layer 13. The nitride semiconductor layer 13 may be formed by, for example, MOCVD (Metal Organic Chemical Vapor Deposition). The insulation substrate 10 is formed. by an insulator such as SiC (silicon carbide). For example, the buffer layer 12 is formed by AlN (aluminum nitride) and may be 320 nm thick. The GaN layer 14 has a thickness of, for example, 1000 nm. For example, the electron supply layer 16 is made of AlGaN grown to a thickness of 20 nm. The electron supply layer 16 is doped with, for example, Si atoms with a doping concentration of $1 \times 10^{17} \sim 1 \times 10^{18}$ cm$^{-3}$.

Figure 2B:
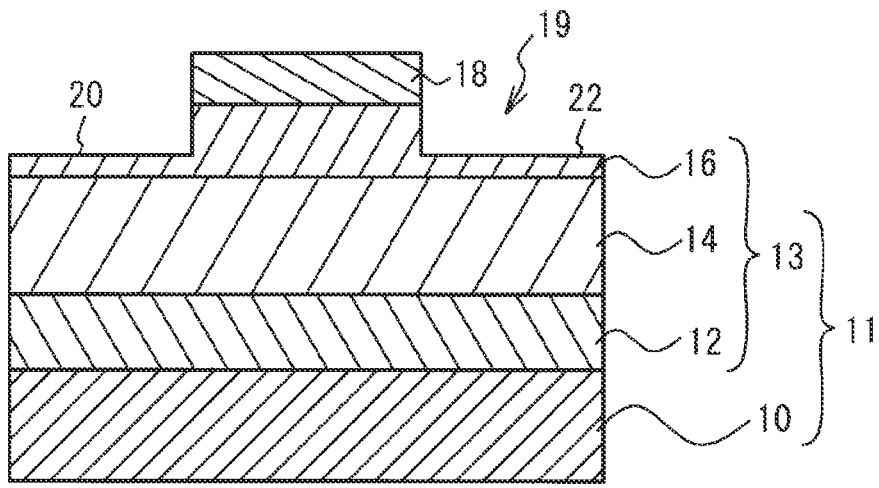

Referring to FIG. 2B, a resist 18 is formed on the electron supply layer 16 so that a part of the layer 16 is exposed. Then, etching is performed. This etching results in a recess 19 in the electron supply layer 16. As will be described layer, a source region 20 in which the source electrode 30 is formed and a drain region 22 in which the drain electrode 32 is formed are located in the recess 19.

Figure 2C:
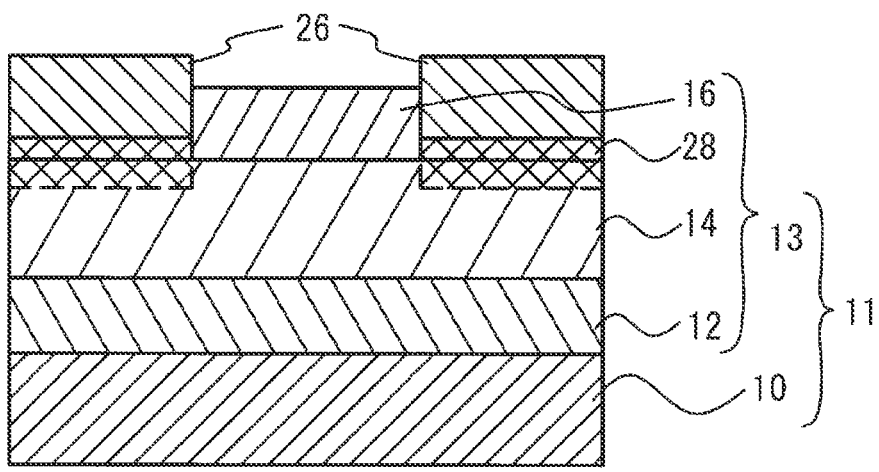

Referring to FIG. 2C, ohmic electrodes 26 are formed in the source region 20 and the drain region 22 by a vapor deposition method and a liftoff method so that the ohmic electrodes 26 contact the electron supply layer 16. That is, the ohmic electrodes 26 are formed over the whole recess 19. The ohmic electrodes 26 may be formed by Ta/Al, for example. For example, the Ta layer may be 10 nm thick, and the Al layer may be 300 nm thick. After the ohmic electrodes 26 are formed, the semiconductor substrate 11 is heated up to 565° C. for annealing. Thus, Ta atoms or Al atoms are diffused into the GaN layer 14 and the electron supply layer 16 from the ohmic electrodes 26. This diffusion results in the low-resistance layer 28 in the GaN layer 14 and the electron supply layer 16. The electric resistance of the low-resistance layer 28 is smaller than that of the GaN layer 14 and that of the electron supply layer 16. It is thus preferable that the low-resistance layer 28 reaches the GaN layer 14. The low-resistance layer 28 is formed in the region in which the ohmic electrodes 26 are formed, that is, below the lower side of the whole recess 19. In other words, the low-resistance layer 28 is formed in the source region 20 and the drain region 22.

Figure 3A:
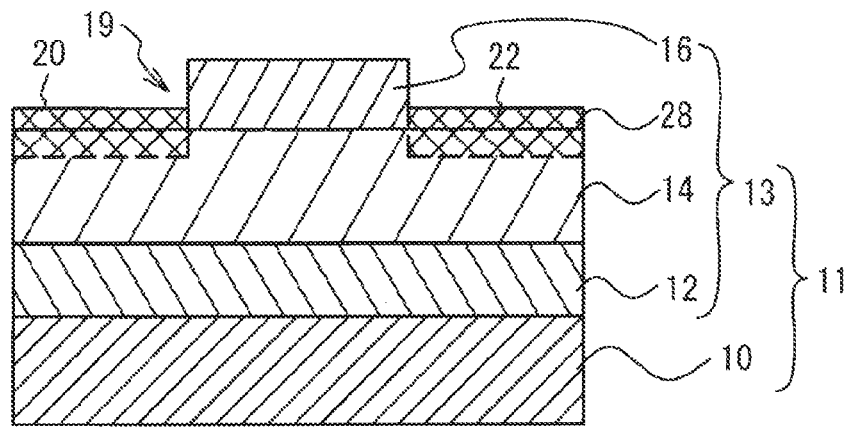
FIGS. 3A through 3C are cross-sectional views that illustrate subsequent steps of the exemplary fabricating method in accordance with die first embodiment.

Referring to FIG. 3A, all the ohmic electrodes 26 are removed by, for example, etching. Etchant may be hydrofluoric acid. In this process, the low-resistance layer 28 remains in the GaN layer 14 and the electrode supply layer 16.

Figure 3B:
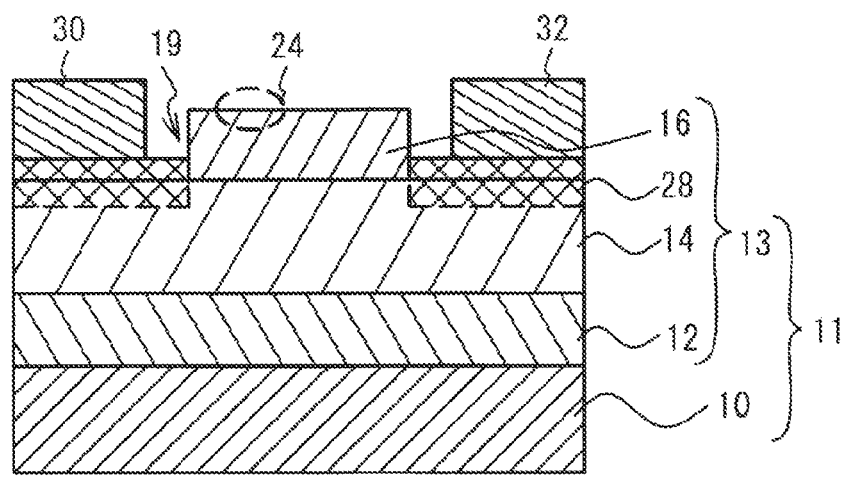
Figure 3C:
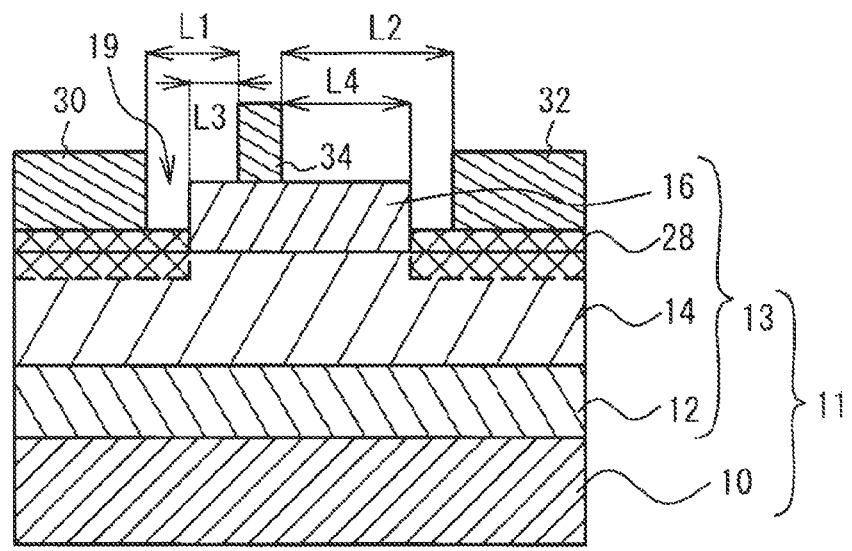

Referring to FIG. 3B, the source electrode 30 and the drain. electrode 32 are respectively formed in the source region 20 and the drain region 22 by a vapor deposition method and a liftoff method so as to contact the electron supply layer 16. The source electrode 30 and the drain electrode 32 may be formed by Ta/Al. The source electrode 30 and the drain electrode 32 have widths less than those of the ohmic electrodes 26. Thus, a part of the upper surface of the low-resistance layer 28 close to a gate region 24 (broken line in FIG. 3E) in which the gate electrode 34 should be formed in a later step is exposed. In other words, on the upper face of the nitride semiconductor layer 13, the distances between edges of the low-resistance layer 28 located in the source region 20 and the drain region 22 and the gate region 24 are smaller than the distance between the source electrode 30 and the gate region 24 and that between the drain region 22 and the gate region 24. After the source electrode 30 and the drain electrode 32 are formed, the semiconductor substrate 11 is heated up to 565° C. for annealing.

Referring to FIG. 30, the gate electrode 34 is formed on the electron supply layer 16 in the gate region 24 by, for example, the vapor deposition method and the lift-off method. Each of the source electrode 30 and the drain electrode 32 and the gate electrode 34 are spaced apart from each other on the upper face of the nitride semiconductor layer 13. The gate electrode 34 is interposed between the source electrode 30 and the drain electrode 32 and is closer to the source electrode 30. That is, a distance L1 between the source electrode 30 and the gate electrode 34 is smaller than a distance L2 between the drain electrode 32 and the gate electrode 34. In other words, the source electrode 30 and the drain electrode 32 are asymmetrical about the gate electrode 34. On the face of the nitride semiconductor layer 13, a distance L3 between the low-resistance layer 28 formed in the source region 20 and the gate electrode 34 is smaller than the distance L1 between the source electrode 30 and the gate electrode 34. A distance L4 between the low-resistance layer 28 formed in the drain region 22 and the gate electrode 34 is smaller than the distance L2 between the drain electrode 32 and the gate electrode 34. In other words, the edges of the source electrodes 30 and the drain electrodes 34 are farther away from the gate electrode 34 than the edges of the low-resistance layer 28. The gate electrode 34 may be formed by, for example, Ni/Au. The semiconductor device is fabricated by the above-described fabrication method of the first embodiment.

In the method for fabricating the semiconductor device in accordance with the first embodiment, annealing is carried out after the ohmic electrodes 26 are formed in the source region 20 and the drain region 22, so that the low-resistance layer 28 can be formed in the source region 20 and the drain region 22. After the ohmic electrodes 26 are removed, the source electrode 30 and the drain electrode 32 are formed so that the edges of the source electrode 30 and the drain electrode 32 are farther away from the gate electrode 34 than the edges of the low-resistance layer 28 formed in the source region 20 and the drain region 22. Thus, according to the first embodiment, it is possible to reduce the electrical resistance between the electrodes and suppress short-circuiting between the electrodes. In the first embodiment, the recess 19 is formed in the nitride semiconductor layer 13. Thus, as compared with the case where the recess 19 is not formed, the electrical resistance between the electrode is small and the signal loss is also small.

The insulation substrate 10 may be formed of Si or sapphire instead. of SiC. The ohmic electrodes 26, the source electrode 30 and the drain electrode 32 are not limited to Ta/Al but may be formed by another combination of metals. In this case, it is preferable that atoms are likely to diffuse in the GaN layer 14 and the electron supply layer 16 from the metals and to form the low-resistance layer 28. For example, Ti/Al may be used. The nitride semiconductor is a semiconductor including nitrogen, and may be InN (indium nitride), AlN (aluminum nitride) , InGaN (indium gallium nitride), InAlN (indium aluminum nitride), AlInGaN (aluminum indium gallium nitride), AlGaN (aluminum gallium nitride), or GaN (gallium nitride).

In the process of FIG. 3A, the ohmic electodes 26 are entirely removed from both sides of the source region 20 and the drain region 22. Instead, the ohmic electrode 26 may be removed from one of the source region 20 and the drain region 22. In this case, the ohmic electrode 26 that has not been removed but remains functions as either the source electrode 30 or the drain electrode 32. That is, the whole ohmic electrode 26 may be removed from at least one of the source region 20 and the drain region 22. In this case, in the process illustrated in FIG. 3B, at least one of the source electrode 30 and the drain electrode 32 is formed so that the edge of one of the source electrode 30 and the drain electrode 32 is farther away from the gate electrode 34 than the edge of the low-resistance layer 28 formed in at least one of the source region 20 and the drain region 22.

In the first embodiment, the distance L1 between the source electrode 30 and the gate electrode 34 is smaller than the distance L2 between the drain electrode 32 and the gate electrode 34. This is intended to decrease the source resistance and increase the gate-drain breakdown voltage. In order to reduce the source resistance and suppress short-circuiting, the source electrode 30 is preferably formed so that the distance from the low-resistance layer 28 in the source region 20 and the gate electrode 34 is smaller than the distance between the source electrode 30 and the gate electrode 34. In order to suppress the loss of signal, the source electrode 30 and the drain electrode 32 are preferably formed so that the distance between the low-resistance layer 28 in the source region 20 and the gate electrode 34 and the distance between the low-resistance layer 28 in the drain region 22 and the gate electrode 34 are smaller than the distance between the source electrode 30 and the gate electrode 34 and that between the drain electrode 32 and the gate electrode 34.

(Second Embodiment)

Figure 4A:
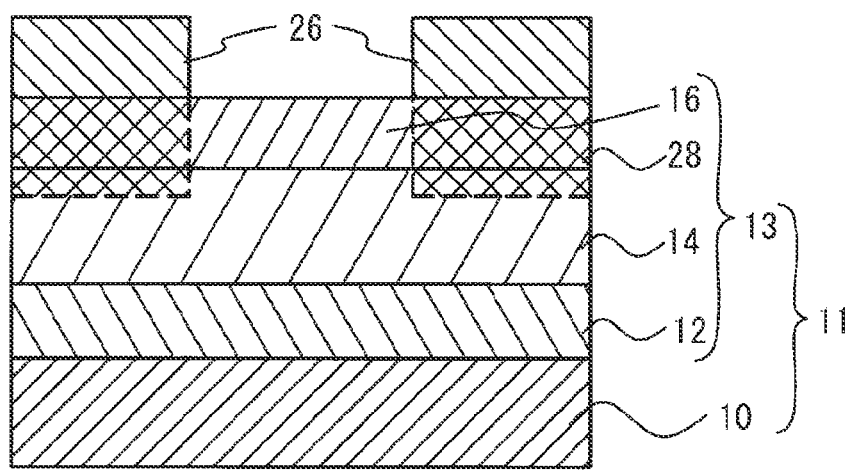
FIGS. 4A through 4C are cross-sectional views that illustrate an exemplary method for fabricating a semiconductor device in accordance with a second embodiment.
Figure 4B:
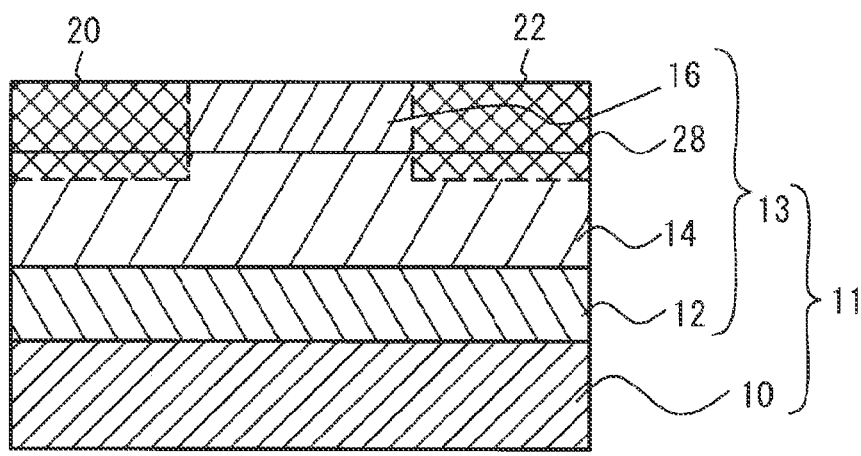
Figure 4C:
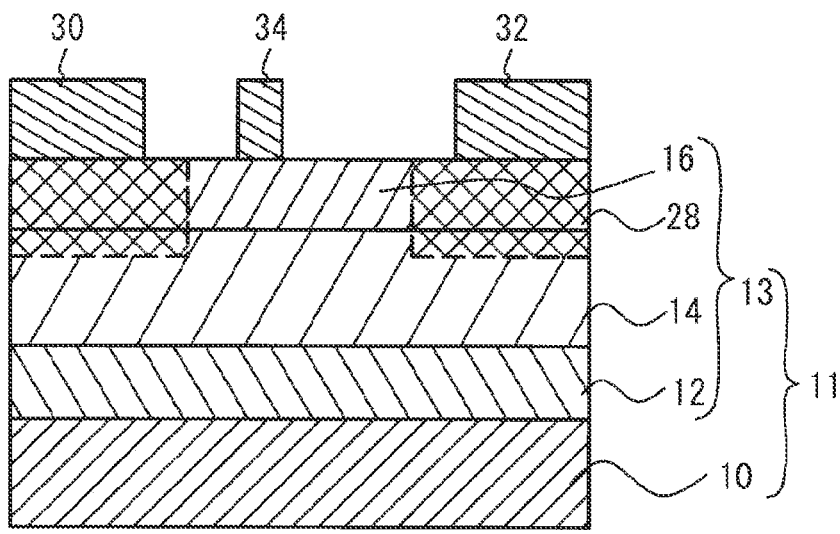

A second embodiment is an example in which the recess 19 is not formed. FIGS. 4A through 4C are cross-sectional views that illustrate a method for fabricating a semiconductor device in accordance with a second embodiment. A description is not given of parts of the second embodiment that are similar to those previously described.

Referring to FIG. 4A, the step of forming the recess 19 in the nitride semiconductor layer 13 is not carried out but the ohmic electrodes 26 are formed in the source region 20 and the drain region 22 of the electron supply layer 16. After the step of forming the ohmic electrodes 26, annealing is carried out at a temperature of, for example, 565° C. Thus, the low-resistance layer 28 is formed in the GaN layer 14 and the electron supply layer 16.

Referring to FIG. 4B, the ohmic electrodes 26 are removed. Referring to FIG. 4C, the source electrode 30 and the drain electrode 32 are respectively formed in the source region 20 and the drain region 22. Then, annealing is carried out. Then, the gate electrode 34 is formed on the electron supply layer 16. In this step, as in the case of FIG. 3C, the distance L3 between the low-resistance layer 28 formed in the source region 20 is smaller than the distance L1 between the source electrode 30 and the gate electrode 34. The distance L4 between the low-resistance layer 28 formed in the drain region 22 and the gate electrode 34 is smaller than the distance L2 between the drain electrode 32 and the gate electrode 34.

According to the second embodiment, the recess 19 is not formed, nevertheless the electrical resistance between the electrodes can be reduced and short-circuiting between the electrodes can be suppressed. Omission of the step of forming the recess 19 leads to reduction in the manufacturing cost.

(Third Embodiment)

Figure 5A:
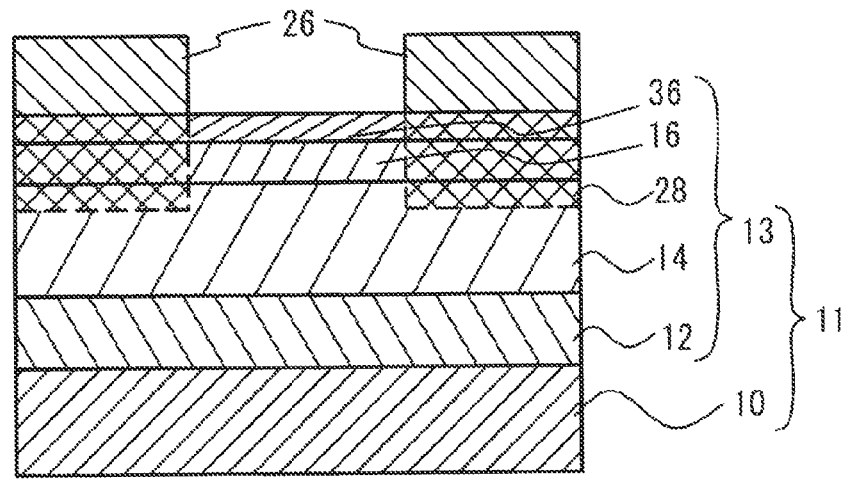
FIGS. 5A through 5C are cross-sectional views that illustrate an exemplary method for fabricating a semiconductor device in accordance with a third embodiment.
Figure 5B:
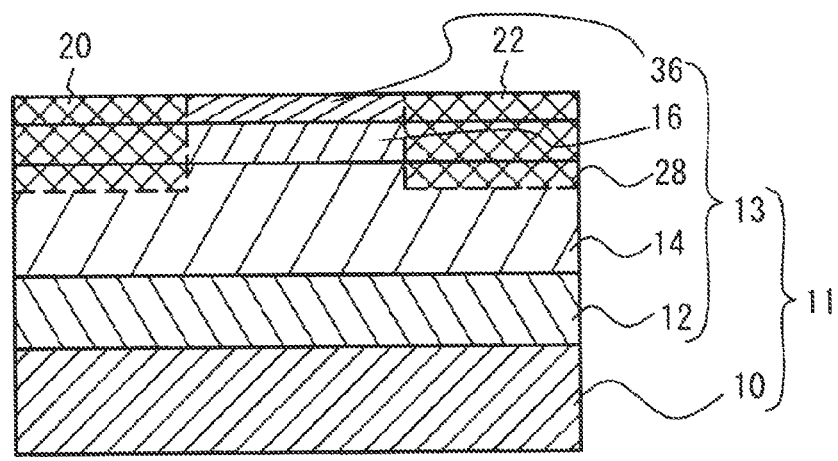
Figure 5C:
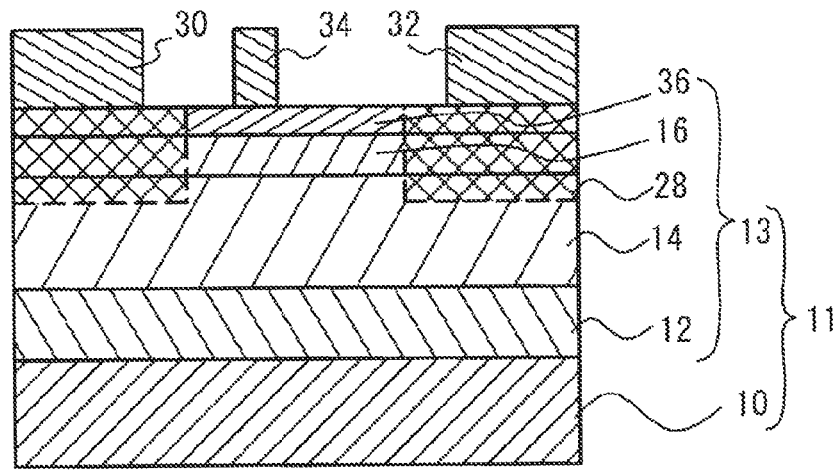

A third embodiment is an example in which the recess 19 is not formed but a cap layer 36 is formed. FIGS. 5A through 5C are cross-sectional views that illustrate a method for fabricating a semiconductor device in accordance with the third embodiment. A description is not given of parts of the third embodiment that are similar to those previously described.

Referring to FIG. 5A, the step of forming the recess 19 is not carried out, but the ohmic electrodes 26 are formed on the cap layer 36. After the ohmic electrodes 26 are formed, annealing is carried out so that the low-resistance layer 28 can be formed in the GaN layer 14, the electron supply layer 16 and the cap layer 36.

Referring to FIG. 5B, the ohmic electrodes 26 are removed. Referring to FIG. 5C, the source electrode 30 and the drain electrode 32 are formed and annealing is carried out. After annealing, the gate electrode 34 is formed on the cap layer 36. The semiconductor device is fabricated by the above-described fabrication method of the first embodiment.

According to the third embodiment, the recess 19 is not formed but the cap layer 36 is provided, nevertheless it is possible to reduce the electrical resistance between the electrodes and suppress short-circuiting between the electrodes as in the case of the first and second embodiments. Since the step of forming the recess 19 is omitted, the cost reduction of the semiconductor device can be achieved. The recess 19 may be formed in addition to the cap layer 36. That is, the third embodiment may be combined. with the first embodiment.

(Fourth Embodiment)

Figure 6A:
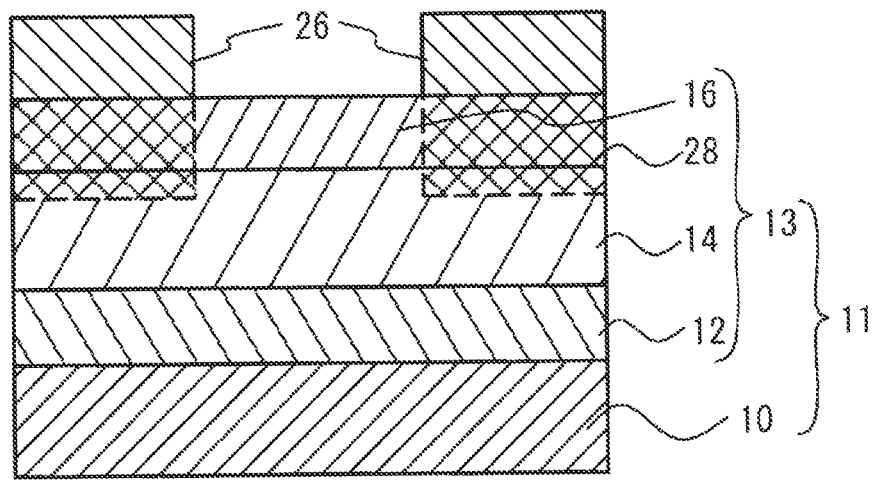
FIGS. 6A and 6E are cross-sectional views that illustrate an exemplary method for fabricating a semiconductor device in accordance with a fourth embodiment.
Figure 6B:
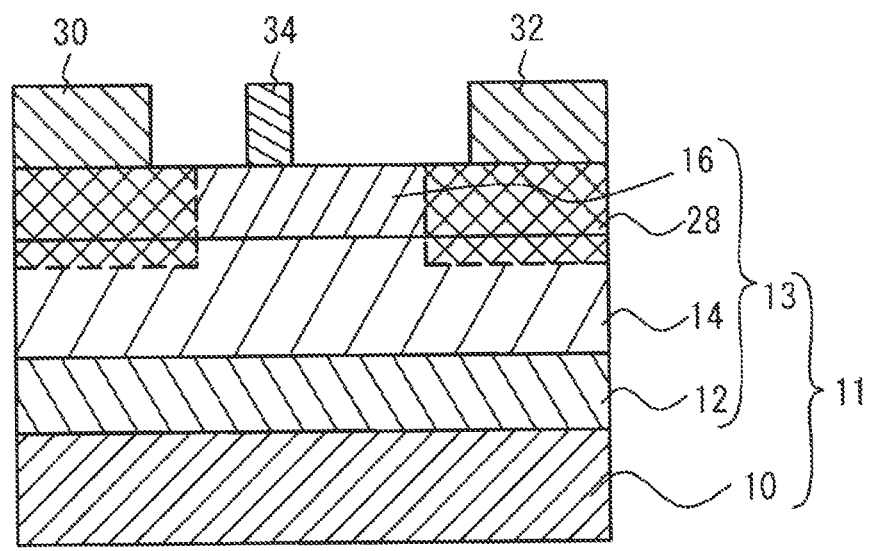

A fourth embodiment is an example in which the ohmic electrodes 26 are partly removed and no electrode is formed. FIGS. 6A and 6B are cross-sectional views that illustrate a method for fabricating a semiconductor device in accordance with the fourth embodiment. A description is not given of parts of the fourth embodiment that are similar to those previously described.

Referring to FIG. 6A, the low-resistance layer 28 is formed in the GaN layer 14 and the electron supply layer 16 by annealing. This is the same state as illustrated in FIG. 4A.

Referring to FIG. 6B, the ohmic electrodes 26 are partly removed in the lateral direction. That is, the ohmic electrodes 26 are partly removed so that the distance from the low-resistance layer 28 to the gate electrode 34 is smaller than the distance from the ohmic electrode 26 to the gate electrode 34 on the upper face of the nitride semiconductor layer 13. The ohmic electrodes 26 that remain in the source region 20 and the drain region 22 function as the source electrode 30 and the drain electrode 32, respectively. In other words, the ohmic electrodes 26 are partly removed so that the edges of the source electrode 30 and the drain electrode 32 are farther away from the gate electrode 34 than the edges of the low-resistance layer 28. The semiconductor device is fabricated by the above-described fabrication method of the fourth embodiment.

According to the fourth embodiment, the ohmic electrodes 26 are partly removed, nevertheless it is possible to reduce the electrical resistance between the electrodes and suppress short-circuiting between the electrodes as in the case of the first embodiment. Since the remaining ohmic electrodes 26 function as the source electrode 30 and the drain electrode 32, there is no need to perform the step of forming electrodes again. Thus, the fabrication process may be simplified and the cost reduction of the semiconductor device may be achieved. The step of partly removing the ohmic electrodes 26 may be a step of removing the ohmic electrode 26 from one of the source region 20 and the drain region 22.

In the above description of the fourth embodiment, the ohmic electrodes 26 are partly removed from both the source region 20 and the drain region 22. Instead, the ohmic electrode 26 may be partly removed from either the source region 20 or the drain region 22.

In FIGS. 6A and 6B, the recess 19 is not formed as in the case of the second embodiment. However, the fourth embodiment may be applied to a case where the recess 19 is formed or another case the can layer 36 is formed.

The embodiments of the present invention have been described in detail. However, the present invention is not limited to the specifically described embodiments, but may include other embodiments and variations without departing from the scope of the present invention.

What is claimed is:

1. A method for fabricating a semiconductor device comprising:
   forming ohmic electrodes on a source region and a drain region of a nitride semiconductor layer;
   forming a low-resistance layer between an uppermost surface of the nitride semiconductor layer and the ohmic electrodes by annealing the nitride semiconductor layer;
   partly removing the ohmic electrodes after forming the low-resistance layer so that a distance between an edge of at least one of the source region and the drain region and a gate electrode is longer than a distance between an edge of the low-resistance layer and the gate electrode.

2. The method according to claim 1, further comprising forming a recess in the nitride semiconductor layer before forming the ohmic electrodes, the source region and the drain region being located in the recess.

3. The method according to claim 1, wherein the ohmic electrodes comprise a multilayer structure of Ti/Al or Ta/Al.

4. The method according to claim 1, wherein the nitride semiconductor layer comprises one of InN, AlN, InGaN, InAlN, AlInGaN, AlGaN, or GaN.

* * * * *